(12) United States Patent
Do et al.

(10) Patent No.: US 8,968,514 B2
(45) Date of Patent: Mar. 3, 2015

(54) GAS DISTRIBUTING DEVICE AND SUBSTRATE PROCESSING APPARATUS INCLUDING THE SAME

(75) Inventors: Jae-Chul Do, Daegu (KR); Bu-Il Jeon, Gyeonggi-do (KR); Myung-Gon Song, Jeollanam-do (KR); Jung-Rak Lee, Gyeonggi-do (KR)

(73) Assignee: Jusung Engineering Co., Ltd. (KR)

( * ) Notice: Subject to any disclaimer, the term of this patent is extended or adjusted under 35 U.S.C. 154(b) by 804 days.

(21) Appl. No.: 13/167,287

(22) Filed: Jun. 23, 2011

(65) Prior Publication Data

US 2011/0315320 A1    Dec. 29, 2011

(30) Foreign Application Priority Data

Jun. 23, 2010 (KR) .................. 10-2010-0059605

(51) Int. Cl.
| | | |
|---|---|---|
| *C23C 16/509* | (2006.01) | |
| *C23C 16/505* | (2006.01) | |
| *C23C 16/50* | (2006.01) | |
| *C23F 1/00* | (2006.01) | |
| *H01L 21/306* | (2006.01) | |
| *C23C 16/455* | (2006.01) | |
| *H01J 37/32* | (2006.01) | |
| *C23C 16/06* | (2006.01) | |
| *C23C 16/22* | (2006.01) | |

(52) U.S. Cl.
CPC ..... *C23C 16/45565* (2013.01); *C23C 16/45574* (2013.01); *C23C 16/509* (2013.01); *H01J 37/32091* (2013.01); *H01J 37/3244* (2013.01)
USPC ............ 156/345.45; 156/345.43; 156/345.44; 118/723 E; 118/723 R

(58) Field of Classification Search
USPC ....... 156/345.45, 345.43, 345.44; 118/723 E, 118/723 R
See application file for complete search history.

(56) References Cited

U.S. PATENT DOCUMENTS

| | | | | |
|---|---|---|---|---|
| 5,113,790 | A * | 5/1992 | Geisler et al. ............. | 118/723 E |
| 5,981,899 | A * | 11/1999 | Perrin et al. ............. | 219/121.52 |
| 6,189,485 | B1 * | 2/2001 | Matsuda et al. .......... | 118/723 E |
| 6,446,572 | B1 * | 9/2002 | Brcka ..................... | 118/723 ER |
| 7,090,705 | B2 * | 8/2006 | Miyazaki et al. ............ | 29/25.01 |
| 7,632,379 | B2 * | 12/2009 | Goto et al. ............... | 156/345.44 |
| 8,018,163 | B2 * | 9/2011 | Wi ............................ | 315/111.21 |
| 8,328,982 | B1 * | 12/2012 | Babayan et al. .......... | 156/345.43 |
| 8,636,871 | B2 * | 1/2014 | Sawada et al. ............ | 156/345.47 |
| 2005/0183666 | A1 * | 8/2005 | Tsuji et al. ................. | 118/723 E |
| 2011/0005681 | A1 * | 1/2011 | Savas et al. .............. | 156/345.33 |
| 2011/0005682 | A1 * | 1/2011 | Savas et al. .............. | 156/345.34 |
| 2011/0120375 | A1 * | 5/2011 | Song et al. ................. | 118/723 E |
| 2011/0214812 | A1 * | 9/2011 | Song et al. ................ | 156/345.33 |
| 2011/0315320 | A1 * | 12/2011 | Do et al. ................... | 156/345.34 |
| 2012/0000609 | A1 * | 1/2012 | Do et al. ................... | 156/345.48 |
| 2012/0247390 | A1 * | 10/2012 | Sawada et al. ......... | 118/723 AN |

* cited by examiner

*Primary Examiner* — Rudy Zervigon

(57) ABSTRACT

A gas distribution device for a substrate treating apparatus includes a plurality of plasma source electrodes having a first side surface; a plurality of plasma ground electrodes having a second side surface facing the first side surface, the plurality of plasma ground electrodes being alternately arranged with the plurality of plasma source electrodes; and a first gas providing part disposed at each plasma source electrode and including a first space, a plurality of first through-holes in communication with the first space for providing a first process gas between one of the plurality of plasma source electrodes and a corresponding ones of the plurality of plasma ground electrodes, and a first discharging portion at the first side surface.

28 Claims, 7 Drawing Sheets

GAS DISTRIBUTING DEVICE AND SUBSTRATE PROCESSING APPARATUS INCLUDING THE SAME

This application claims the benefit of Korean Patent Application No. 2010-0059605, filed on Jun. 23, 2010, which is hereby incorporated by reference for all purposes as if fully set forth herein.

BACKGROUND

1. Technical Field

The present invention relates to a substrate processing apparatus, and more particularly, to a gas distribution means including a plasma discharging part and a substrate treating apparatus including the gas distribution means.

2. Discussion of the Related Art

Generally, a thin film deposition process for depositing a thin film on a substrate and a photo-lithography process, which includes an etching process, for patterning the thin film are required to manufacture a semiconductor device, a display device and a thin solar cell. Among these processes, the thin film deposition process and the etching process are processed in a substrate treating apparatus having a vacuum condition. In the substrate treating apparatus, an activated gas or an ionized gas is provided onto the substrate through a gas distribution means to deposit the thin film on the substrate or etch the thin film from the substrate.

FIG. 1 is a cross-sectional view of the related art conventional substrate treating apparatus. The apparatus in FIG. 1 may be a plasma enhanced chemical vapor deposition apparatus.

Referring to FIG. 1, the substrate treating apparatus 10 includes a process chamber 12 for providing a reaction space, a susceptor 16 disposed in the process chamber 12 and a gas distribution means 18 for providing a process gas onto a substrate 14. The substrate 14 is disposed on the susceptor 16. A chamber lead 12a and a chamber body 12b constitute the process chamber 12.

The substrate treating apparatus 10 further includes an edge frame 20, a gas supplying pipe 22, a gate valve (not shown) and an exhaust port 24. The edge frame 20 is disposed at an inner side of the process chamber 12 to shield edges of the substrate 14. When the susceptor 16 is positioned at a process location, the edge frame 20 shields the edges of the substrate 14 such that a thin film is not deposited on the edges of the substrate 14. The gas supplying pipe 22 is disposed through the chamber lead 12a for supplying the process gas into the gas distribution means 20. The gate valve is a gate for the substrate 14. Remained gases in the process chamber 12 are exhausted through the exhaust port 24. In addition, a vacuum condition is controlled by the exhaust port 24. Although not shown, a vacuum pump may be connected to the exhaust port 24.

The chamber body 12b is combined to the chamber lead 12a with an O-ring (not shown). The gas distribution means 18 is electrically connected to the chamber lead 12a. A radio frequency (RF) power source 26 for providing a RF power is connected to the chamber lead 12a, and the susceptor 16 is grounded. A matcher 30 for impedance matching is installed between the chamber lead 12a and the RF power source 26. Accordingly, the chamber lead 12a and the susceptor 16 respectively function as an upper electrode and a lower electrode. When the process gas is provided into the reaction space, the process gas is activated or ionized by the upper and lower electrodes. A heater 26 is installed in the susceptor 14 to heat the substrate 14. A susceptor supporter 28 for moving upward and downward the susceptor 14 is disposed under the susceptor 14.

A gas diffusing space 32 is defined between the gas distribution means 18 and the chamber lead 12a. A baffle (not shown) is disposed in the gas diffusing space 32 such that the process gas is uniformly diffused. A plurality of gas injection holes 34 are formed at the gas distribution means 18 to provide the process gas toward the susceptor 16.

The thin film formed on the substrate 14 is required to have a uniform thickness and a uniform property. For example, the uniformity of the thin film is strongly affected by the uniformity of provided process gas. Accordingly, to uniformly provide the process gas, the plurality of gas injection holes 34 are formed at the gas distribution means 18.

However, there are problems in the related art substrate treating apparatus as followings. There is a deviation in a plasma concentration. Since the process gas is directly provided into a first region corresponding to each of the plurality of gas injection holes 34, a plasma concentration in a first region is greater than that in a second region between the injection holes 34. As a result, it is very difficult to obtain a uniform thin film because of the deviation of the plasma concentration.

SUMMARY

Accordingly, the present invention is directed to a gas distribution means and a substrate treating apparatus including the same that substantially obviate one or more of the problems due to limitations and disadvantages of the related art.

Additional features and advantages of the invention according to some embodiments will be set forth in the description which follows, and in part will be apparent from the description, or may be learned by practice of the invention. The objectives and other advantages of the invention according to some embodiments will be realized and attained by the structure particularly pointed out in the written description and claims hereof as well as the appended drawings.

To achieve these and other advantages and in accordance with the purpose of the present invention, as embodied and broadly described herein, a gas distribution device for a substrate treating apparatus includes a plurality of plasma source electrodes having a first side surface; a plurality of plasma ground electrodes having a second side surface facing the first side surface, the plurality of plasma ground electrodes being alternately arranged with the plurality of plasma source electrodes; and a first gas providing part disposed at each plasma source electrode and including a first space for a first process gas, a plurality of first through-holes through the first side surface and connected to the first space, and a first discharging portion at the first side surface.

In another aspect, a substrate treating apparatus includes a process chamber including a chamber lead and a chamber body, the chamber lead and the chamber body combined to provide a reaction space; a susceptor in the reaction space, wherein a substrate is disposed on the susceptor; and a gas distribution device including: a plurality of plasma source electrodes having a first side surface and combined with the chamber lead; a plurality of plasma ground electrodes having a second side surface facing the first side surface, the plurality of plasma ground electrodes being alternately arranged with the plurality of plasma source electrodes and being combined with the chamber lead; and a first gas providing part disposed at each plasma source electrode and including a first space for a first process gas, a plurality of first through-holes through the first side surface and connected to the first space, and a first discharging portion at the first side surface.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Reference will now be made in detail to the preferred embodiments, examples of which are illustrated in the accompanying drawings.

Figure 1:
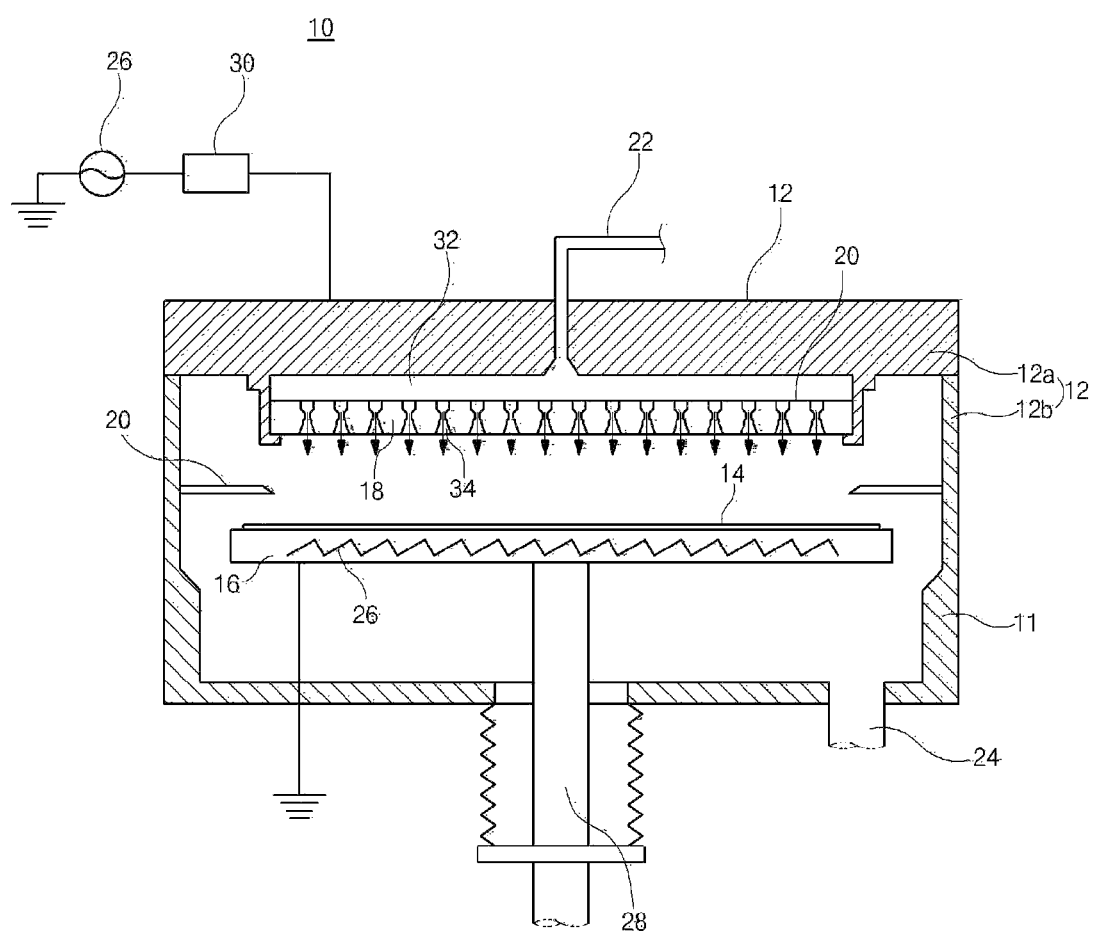
FIG. 1 is a cross-sectional view of the related art substrate treating apparatus.
Figure 2:
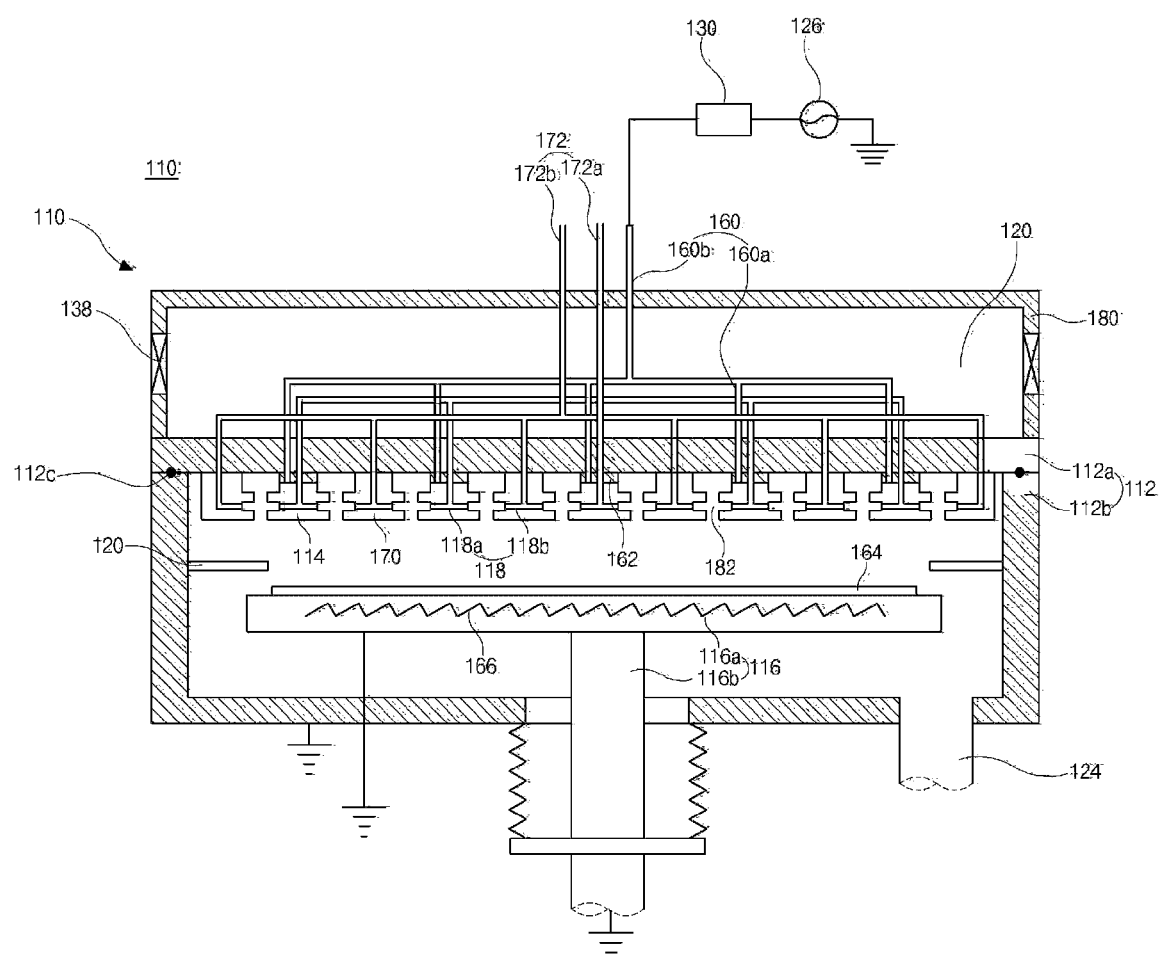
FIG. 2 is a cross-sectional view of a substrate treating apparatus according to an embodiment of the present invention.

FIG. 2 is a cross-sectional view of a substrate treating apparatus according to an embodiment of the present invention. As shown in FIG. 2, a substrate treating apparatus 110 according to an embodiment of the present invention includes a process chamber 112 as a reaction space, a plurality of plasma source electrodes 114, a plurality of plasma ground electrodes 170, a gas providing part 118 and a susceptor 116. The plasma electrodes 114, the plasma ground electrodes 170 and the gas providing part 118 constitute a gas distribution means.

A chamber lead 112a and a chamber body 112b constitute the process chamber 112. The plurality of plasma source electrodes 114 and the plurality of plasma ground electrodes 170 are combined with the chamber lead 112a. The plurality of plasma source electrodes 114 and the plurality of plasma ground electrodes 170 are disposed in the process chamber 112 and alternately arranged with each other. The gas providing part 118 are formed at each of the plurality of plasma source electrodes 114 and the plurality of plasma ground electrodes 170. The susceptor 116 is disposed in the process chamber 112, and a substrate 164 is disposed on the susceptor 116.

The substrate treating apparatus 110 further includes a gas supplying pipe 172 for supplying a process gas into the gas providing part 118. The substrate treating apparatus 110 further includes a feeding line 160 connected to each of the plurality of plasma source electrodes 114. The substrate treating apparatus 110 further includes a housing 180 over the chamber lead 112a. The housing 180 provides a space with the chamber lead 112a for the feeding line 160. The substrate treating apparatus 110 further includes an edge frame 120, a gate valve (not shown) and an exhaust port 124.

The chamber body 112b is combined to the chamber lead 112a with an O-ring (not shown). The gas providing part 118 includes a first gas providing part 118a connected to the plasma source electrode 114 and a second gas providing part 118b connected to the plasma ground electrode 170. In addition, a space between the plasma source electrode 114 and the plasma ground electrode 170 serves as a plasma discharging space. When the process gas is supplied into the plasma discharging space through the gas providing part 118, the process gas in the plasma discharging space is activated or ionized. Accordingly, the activated or ionized process gas is provided onto the substrate 164 to form a thin film or etch a thin film.

FIG. 2 shows the first gas providing part 118a and the second gas providing part 118b. Alternatively, the substrate treating apparatus 110 may include one of the first gas providing part 118a and the second gas providing part 118b without the other one of the first gas providing part 118a and the second gas providing part 118b.

The plasma discharging space between the plasma source electrode 114 and the plasma ground electrode 170 serves as a gas injection hole 182. In the present invention, to uniformly provide the process gas onto the substrate 164, a number of the gas injection holes 182 can be increased. Namely, when an area of the chamber lead 112a is constant, a density of the plasma source electrode 114 and the plasma ground electrode 170 is increased by reducing a width of each of the plasma source electrode 114 and the plasma ground electrode 170. As a result, the number of the gas injection holes 182 is also increased. The width of each of the plasma source electrode 114 and the plasma ground electrode 170 or a number of the gas injection holes 182 may be optimized with a condition of the substrate treating process. In addition, to uniformly provide the process gas by increasing a density of the gas injection holes 182, each of the plasma source electrode 114 may have a first width, and each of the plasma ground electrode 170 may have a second width smaller than the first width.

The gas supplying pipe 172 includes a first gas supplying pipe 172a for supplying a first process gas into the first gas providing part 118a and a second gas supplying pipe 172b for supplying a second process gas into the second gas providing part 118b.

The process gas, which is activated or ionized by a plasma discharging in a space between the plasma source electrode 114 and the plasma ground electrode 170, is diffused from the gas injection holes 182 in a radial shape. Accordingly, since the process gases diffused in a radial shape overlap each other, the process gases are uniformly provided onto the substrate 164 on the susceptor 116. As a result, a uniform thin film deposition process or a uniform etching process is performed.

An insulator 162 is disposed between the chamber lead 112a and the plasma source electrode 114. As a result, the plasma source electrode 114 is electrically insulated from the chamber lead 112a. For example, the plasma source electrode 114 is combined to the chamber lead 112a using a connection element, e.g., a bolt, with the insulator 162.

The feeding line 160 is connected to each of the plasma source electrodes 114. The plasma source electrode 114 is connected with a radio frequency (RF) power source 126 in parallel by the feeding line 160, and a matcher 130 for a impedance matching is installed between the plasma source electrode 114 and the RF power source 126. For example, a very high frequency (VHF) having a frequency of 20 to 50 MHz may be for the RF power source 126 to increase plasma generating yield. The feeding line 160 includes a sub-feeding line 160a, which is formed through the chamber lead 112a and the insulator 162 and connected to the plasma source electrode 114, and a main-feeding line 160b connecting the sub-feeding line 160a to the RF power source 126.

The chamber lead 112a has a rectangular shape, and the plasma source electrode 114 has a stripe shape. Namely, the plasma source electrode 114 has a major axis and a minor axis. The plurality of plasma source electrodes 114 are spaced apart from each other by a constant distance. Similarly, the plurality of ground electrodes 170 have a stripe shape and are spaced apart from each other by a constant distance. The plasma source electrode 114 and the plasma ground electrode 170 are arranged to be parallel. The plasma ground electrode 170 is closer to a side wall of the process chamber 112 than the plasma source electrode 114. Namely, two of the plasma ground electrodes 170 are adjacent to the process chamber 112, and the plasma source electrodes 114 and the other plasma ground electrodes 170 are positioned between the two of the plasma ground electrodes 170. As mentioned above, the plasma ground electrodes 170 and the plasma source electrodes 114 are alternately arranged with each other.

The sub-feeding line 160a is connected to the plasma source electrode 114 at an end of the plasma source electrode 114. Alternatively, the sub-feeding line 160a may be connected to the plasma source electrode 114 at a center of the plasma source electrode 114. For example, the plasma ground electrode 170 may be combined with the chamber lead 112a using a connection element, e.g., a bolt. The plasma ground electrode 170 is electrically connected to the chamber lead 112a.

A first distance between the plasma source electrode 114 and the susceptor 116 and a second distance between the plasma ground electrode 170 and the susceptor 116 are substantially equal. Since the insulator 162 is positioned between the plasma source electrode 114 and the chamber lead 112a, a first thickness of the plasma source electrode 114 is smaller than a second thickness of the plasma ground electrode 170. In other word, a thickness of the plasma ground electrode 170 is substantially equal to a summation of a thickness of the plasma source electrode 114 and a thickness of the insulator 162.

The chamber lead 112a, the chamber body 112b, the susceptor 116 also serves as a ground electrode. Each of the plasma source electrode 114, the plasma ground electrode 170, the chamber lead 112a, the chamber body 112b and the susceptor 162 may be formed of a metallic material such as aluminum and stainless steel. The insulator 162 may be formed of a ceramic material such as aluminum oxide.

The edge frame 120 is disposed at an inner side of the process chamber 112 to shield edges of the substrate 164. When the susceptor 116 is positioned at a process location, the edge frame 120 shields the edges of the substrate 164 such that a thin film is not deposited on the edges of the substrate 164. The gate valve is a gate for the substrate 164. Remained gases in the process chamber 112 are exhausted through the exhaust port 124. In addition, a vacuum condition is controlled by the exhaust port 124. Although not shown, a vacuum pump may be connected to the exhaust port 124.

The susceptor 116 includes a substrate supporter 116a, where the substrate 164 is disposed, and a susceptor supporter 116b for moving upward and downward the substrate supporter 116a. The substrate supporter 116a has a size being equal to or larger than the substrate 164. A heater 166 for heating the substrate 164 is installed in the substrate supporter 116a. As mentioned above, the susceptor 116 is grounded. Alternatively, depending on a process condition, an RF power may be applied to the susceptor 116, or the susceptor 116 may be floated.

To prevent a stationary wave effect, each of the plurality of plasma source electrodes 114 has a width smaller than a wavelength of the RF power from the RF power source 126. As a result, an uniform plasma density in the reaction space is achieved.

In the substrate treating apparatus 110, since a heat generated from the feeding line 160 is accumulated in the housing 180, the housing 180 may need to be cooled. Accordingly, a duct 138 is formed at a side wall of the housing 180. In addition, a pan (not shown) may be installed in the duct 138. The housing 180 may be cooled by another method.

Figure 3:
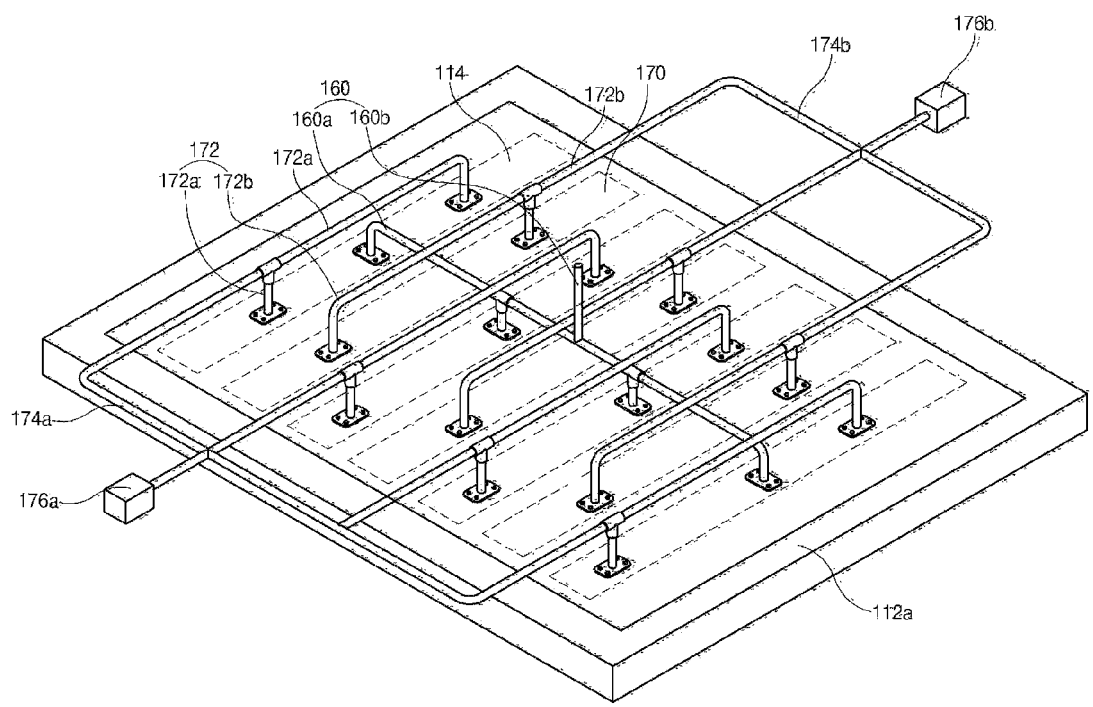
FIG. 3 is a perspective view of a chamber lead for a substrate treating apparatus according to an embodiment of the present invention.

FIG. 3 is a perspective view of a chamber lead for a substrate treating apparatus according to an embodiment of the present invention. For convenience of explanation, the plasma source electrode 114 and the plasma ground electrode 170 are shown by a broken line.

As shown in FIG. 3, the plasma source electrode 114 is connected to the sub-feeding lines 160a, and the sub-feeding lines 160a are connected to the main-feeding line 160b. As shown in FIG. 2, the main-feeding line 160b is connected to the RF power source 126 with the matcher 130. As a result, the plurality of plasma source electrodes 114 are connected to the RF power source 126 in parallel.

Referring to FIG. 2, the gas supplying pipe 172 includes the first gas supplying pipe 172a for supplying a first process gas into the first gas providing part 118a and a second gas supplying pipe 172b for supplying a second process gas into the second gas providing part 118b. The first gas providing part 118a is formed to correspond to the plasma source electrode 114, and the second gas providing part 118b is formed to correspond to the plasma ground electrode 170. The first and second process gases may be same or different.

The first gas providing part 118a corresponds to the first gas supplying pipe 172a in one-to-one. Alternatively, at least two gas supplying pipes 172a are connected to the first gas providing part 118a to improve the uniformity of the first process gas. Similarly, the second gas providing part 118b corresponds to the second gas supplying pipe 172b in one-to-one. Alternatively, at least two gas supplying pipes 172b are connected to the second gas providing part 118b to improve the uniformity of the second process gas.

The first gas supplying pipes 172a, which are connected to the plasma source electrodes 114 and disposed over the chamber lead 112a, are connected to a first source part 176a through a first gas carrying pipe 174a. The second gas supplying pipes 172b, which are connected to the plasma ground electrodes 170 and disposed over the chamber lead 112a, are connected to a second source part 176b through a second gas carrying pipe 174b. The first and second gas carrying pipes 174a and 174b are connected to the first and second gas supplying pipes 172a and 172b, respectively, at a space between the housing 180 and the chamber lead 112a and penetrate a side wall of the housing 180 to be connected to the first and second source parts 176a and 176b, respectively.

Figure 4:
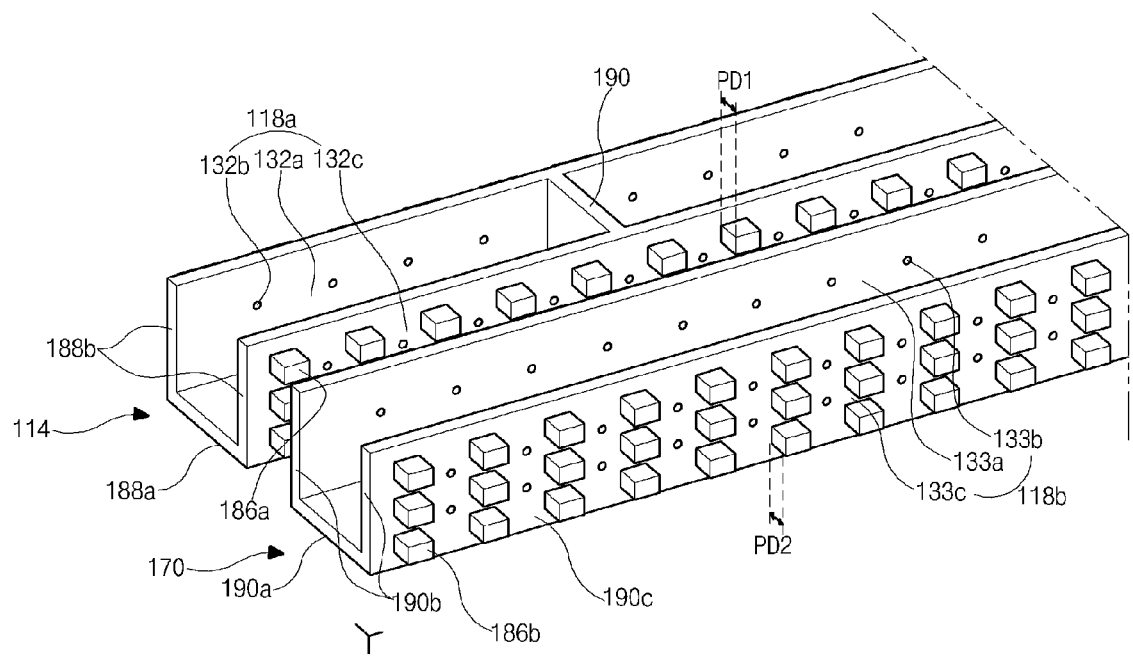
FIG. 4 shows a plasma source electrode and a plasma ground electrode for a substrate treating apparatus according to an embodiment of the present invention.
Figure 5A:
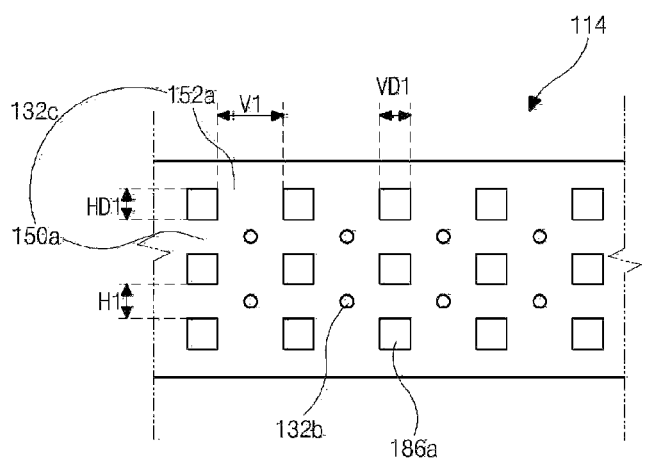
FIGS. 5A and 5B respectively show a side view of a plasma source electrode for a substrate treating apparatus according to an embodiment of the present invention.
Figure 5B:
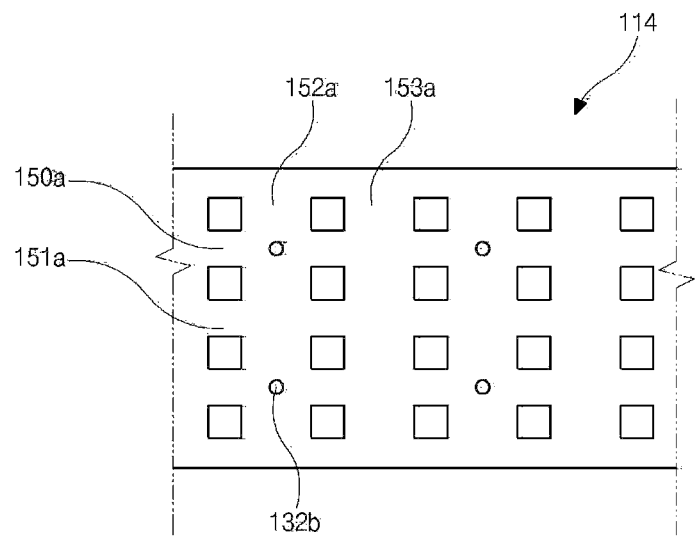
Figure 6A:
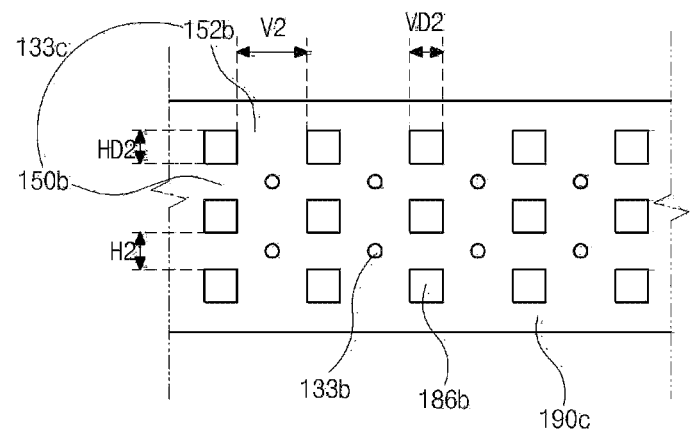
FIGS. 6A and 6B respectively show a side view of a plasma ground electrode for a substrate treating apparatus according to an embodiment of the present invention.
Figure 6B:
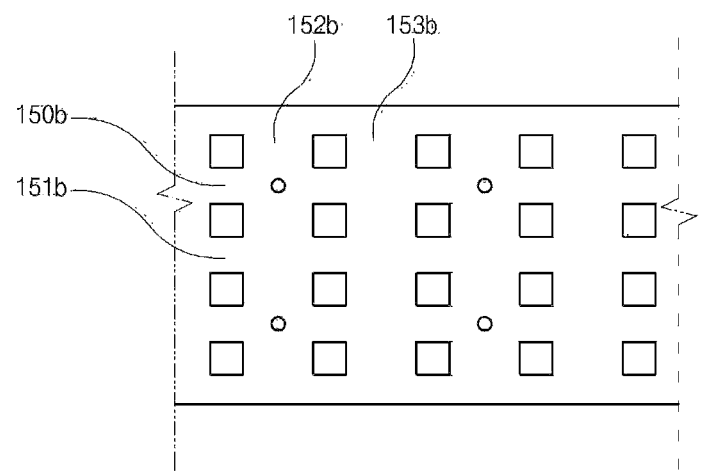
Figure 7:
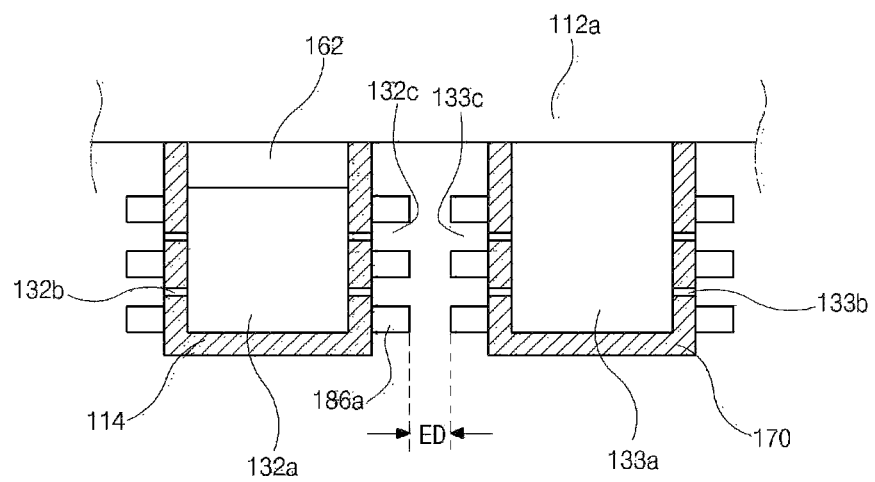
FIG. 7 is a cross-sectional view of a plasma source electrode and a plasma ground electrode for a substrate treating apparatus according to an embodiment of the present invention.

FIG. 4 shows a plasma source electrode and a plasma ground electrode for a substrate treating apparatus according to an embodiment of the present invention, and FIGS. 5A and 5B respectively show a side view of a plasma source electrode for a substrate treating apparatus according to an embodiment of the present invention. FIGS. 6A and 6B respectively show a side view of a plasma ground electrode for a substrate treating apparatus according to an embodiment of the present invention, and FIG. 7 is a cross-sectional view of a plasma source electrode and a plasma ground electrode for a substrate treating apparatus according to an embodiment of the present invention.

As shown in FIG. 4, the plasma source electrode 114 includes a first bottom surface 188a facing the susceptor 116 (of FIG. 2) and a first side surface 188b facing the plasma ground electrode 170. The plasma source electrode 114 has an inner space by the first bottom surface 188a and the first side surface 188b. The plasma ground electrode 170 includes a second bottom surface 190a facing the susceptor 116, and a second side surface 190b facing the plasma source electrode 114. The plasma ground electrode 170 has an inner space by the second bottom surface 190a and the second side surface 190b.

The gas providing part 118 includes the first gas providing part 118a connected to the plasma source electrode 114 and the second gas providing part 118b connected to the plasma ground electrode 170. The first gas providing part 118a and the second gas providing part 118b are positioned between the plasma source electrode 114 and the plasma ground electrode 170. The first gas providing part 118a and the second gas providing part 118b are symmetric with respect to a vertical plane to the susceptor 116 or the chamber lead 112a.

FIG. 4 shows both the first gas providing part 118a and the second gas providing part 118b. Alternatively, only one of the first gas providing part 118a and the second gas providing part 118b is formed to be connected to only one of the plasma source electrode 114 and the plasma ground electrode 170. The gas providing part 118 may be connected to only the plasma source electrode 114.

The plasma source electrode 114 further includes a plurality of first protrusions 186a at the first side surface 188b. The first protrusion 186a has a first height "PD1" from the first side surface 188b. For example, the first height "PD1" may be about 3 to 10 mm.

The first gas providing part 118a, which is connected to the plasma source electrode 114, includes a first space 132a for the first process gas from the first gas supplying pipe 172a, a plurality of first through-holes 132b at the first side surface 188b of the plasma source electrode 114 and a first discharging portion 132c. The first space 132a corresponds to the inner space of the plasma source electrode 114. The first discharging portion 132c corresponds to a space between the first protrusions 186a. The first process gas in the first space 132a is provided into the first discharging portion 132c through the plurality of first through-holes 132b. To uniformly diffuse the first process gas, a baffle (not shown) may be formed in the first space 132a. The baffle may correspond to the first gas supplying pipe 172a.

Referring to FIG. 5A, the first discharging portion 132c includes a first horizontal portion 150a and a first vertical portion 152a. The first horizontal portion 150a is a portion between the first protrusions 186a arranged along a vertical direction, and the first vertical portion 152a is a portion between the first protrusions 186a arranged along a horizontal direction. In other word, the first discharging portion 132c has a matrix shape. The first through-hole 132b is positioned each of crossing portion of the first horizontal portion 150a and the first vertical portion 152a.

The first protrusion 186a has a first length "HD1" and a first width "VD1". The first length "HD1" and the first width "VD1" may be equal. For example, the first length "HD1" and the first width "VD1" may be 3 to 7 mm. The first protrusions 186a along a horizontal direction have a pre-determined distance. Namely, the first vertical portion 152a of the first discharging portion 132c has a first horizontal width "V1". In addition, the first protrusions 186a along a vertical direction have a pre-determined distance. Namely, the first horizontal portion 150a of the first discharging portion 132c has a first vertical width "H1". FIG. 5A shows the first horizontal width "V1" is different from the first vertical width "H1". Alternatively, the first horizontal width "V1" may be substantially equal to the first vertical width "H1". Each of the first horizontal width "V1" and the first vertical width "H1" may be 5 to 10 mm. A diameter of the first through-hole 132b may be about 2 to 3 mm. The first through-holes 132b are arranged in a single row or multi-rows.

Referring to FIG. 4, the first space 132a of the first gas providing part 118a is defined as the inner space of the plasma source electrode 114. To connect the sub-feeding line 160a to a center of the plasma source electrode 114, a partition wall 190 may be formed at a center of the plasma source electrode 114. The first space 132a of the first gas providing part 118a is divided into two portions by the partition wall 190. Alternatively, the sub-feeding line 160a may be connected an end of the plasma source electrode 114 without the partition wall 190.

The first gas providing part 118a is manufactured by a first step of removing a center of the plasma source electrode 114 to form the first space 132a, a second step of partially removing the first side surface 188b of the plasma source electrode 114 to define the first horizontal portion 150a and the first vertical portion 152a of the first discharging portion 132c, and a third step of forming the first through-holes 132b at the first side surface 188b of the plasma source electrode 114. In the second step, the first protrusions 186a are formed at the first side surface 188b of the plasma source electrode 114 to define the first horizontal portion 150a and the first vertical portion 152a of the first discharging portion 132c instead of partially removing the first side surface 188b.

The first process gas is supplied to the first space 132a of the first gas providing part 118a through the first gas supplying pipe 172a (of FIG. 3), and the first discharging portion 132c of the first gas providing part 118a provides a plasma discharging space.

Referring to FIG. 5B, to increase a discharging space, a first sub-horizontal portion 151a is formed between the first horizontal portion 150a, and a first sub-vertical portion 153a is formed between the first vertical portion 152a. The first through-holes 132b are positioned at the crossing portions of the first horizontal portion 150a and the first vertical portion 152a, while there is no first through-hole 132b at the first sub-horizontal portion 151a and the first sub-vertical portion 153a. In FIG. 5B, the first horizontal portion 150a and the first vertical portion 152a respectively have the same width as the first sub-horizontal portion 151a and the first sub-vertical portion 153a. Alternatively, the first horizontal portion 150a and the first vertical portion 152a may have different widths than the first sub-horizontal portion 151a and the first sub-vertical portion 153a, respectively. For example, depending on a diffusion pressure of the first process gas through the first through-holes 132b, the first horizontal portion 150a and the first vertical portion 152a may have widths smaller than the first sub-horizontal portion 151a and the first sub-vertical portion 153a, respectively.

Referring to FIG. 4, the plasma ground electrode 170 further includes a plurality of second protrusions 186b at the second side surface 190b. The second protrusion 186b has a first height "PD2" from the second side surface 190b. For example, the second height "PD2" may be about 3 to about 10 mm.

The second gas providing part 118b, which is connected to the plasma ground electrode 170, includes a second space 133a for the second process gas from the second gas supplying pipe 172b, a plurality of second through-holes 133b at the second side surface 190b of the plasma ground electrode 170 and a second discharging portion 133c. The second space 133a corresponds to the inner space of the plasma ground electrode 170. The second discharging portion 133c corresponds to a space between the second protrusions 186b. The second process gas in the second space 133a is provided into the second discharging portion 133c through the plurality of second through-holes 133b. To uniformly diffuse the second process gas, a baffle (not shown) may be formed in the second space 133a. The baffle may correspond to the second gas supplying pipe 172b.

Referring to FIG. 6A, the second discharging portion 133c includes a second horizontal portion 150b and a second vertical portion 152b. The second horizontal portion 150b is a portion between the second protrusions 186b arranged along a vertical direction, and the second vertical portion 152b is a portion between the second protrusions 186b arranged along a horizontal direction. In other word, the second discharging portion 133c has a matrix shape. The second through-hole 133b is positioned each of crossing portion of the second horizontal portion 150b and the second vertical portion 152b.

The second protrusion 186b has a second length "HD2" and a second width "VD2". The second length "HD2" and the second width "VD2" may be equal. For example, the second length "HD2" and the second width "VD2" may be 3 to 7 mm. The second protrusions 186b along a horizontal direction have a pre-determined distance. Namely, the second vertical portion 152b of the second discharging portion 133c has a second horizontal width "V2". In addition, the second protrusions 186b along a vertical direction have a pre-determined distance. Namely, the second horizontal portion 150b of the second discharging portion 133c has a second vertical width "H2". FIG. 6A shows the second horizontal width "V2" is different from the second vertical width "H2". Alternatively, the second horizontal width "V2" may be substantially equal to the second vertical width "H2". Each of the second horizontal width "V2" and the second vertical width "H2" may be 5 to 10 mm. A diameter of the second through-hole 133b may be about 2 to 3 mm. The second through-holes 133b are arranged in a single row or multi-rows.

Referring to FIG. 4, the second space 133a of the second gas providing part 118b is defined as the inner space of the plasma ground electrode 170. The second process gas is supplied to the second space 133a of the second gas providing part 118b through the second gas supplying pipe 172b (of FIG. 3), and the second discharging portion 133c of the second gas providing part 118b provides a plasma discharging space.

Referring to FIG. 6B, to increase a discharging space, a second sub-horizontal portion 151b is formed between the second horizontal portion 150b, and a second sub-vertical portion 153b is formed between the second vertical portion 152b. The second through-holes 133b are positioned at the crossing portions of the second horizontal portion 150b and the second vertical portion 152b, while there is no second through-hole 133b at the second sub-horizontal portion 151b and the second sub-vertical portion 153b.

In FIG. 6B, the second horizontal portion 150b and the second vertical portion 152b respectively have the same width as the second sub-horizontal portion 151b and the second sub-vertical portion 153b. Alternatively, the second horizontal portion 150b and the second vertical portion 152b may have different widths than the second sub-horizontal portion 151b and the second sub-vertical portion 153b, respectively. For example, depending on a diffusion pressure of the second process gas through the second through-holes 133b, the second horizontal portion 150b and the second vertical portion 152b may have widths smaller than the second sub-horizontal portion 151b and the second sub-vertical portion 153b, respectively.

Referring to FIG. 7, the first protrusion 186a of the plasma source electrode 114 has an electrode gap "ED" with the second protrusion 186b of the plasma ground electrode 170 to provide a sufficient space for a plasma discharging. For example, the electrode gap "ED" may be about 1 to 10 mm. The first discharging portion 132c of the plasma source electrode 114 and the second discharging portion 133c of the plasma ground electrode 170 are symmetric with respect to a central plane, which is perpendicular to the susceptor 116 (of FIG. 2), between the plasma source electrode 114 and the plasma ground electrode 170.

As shown in FIGS. 4 and 5A, since a plasma discharging is generated in the first horizontal portion 150a and the first vertical portion 152a of the first discharging portion 132c and the second horizontal portion 150b and the second vertical portion 152b of the second discharging portion 133c, a plasma density is increased.

Figure 8:
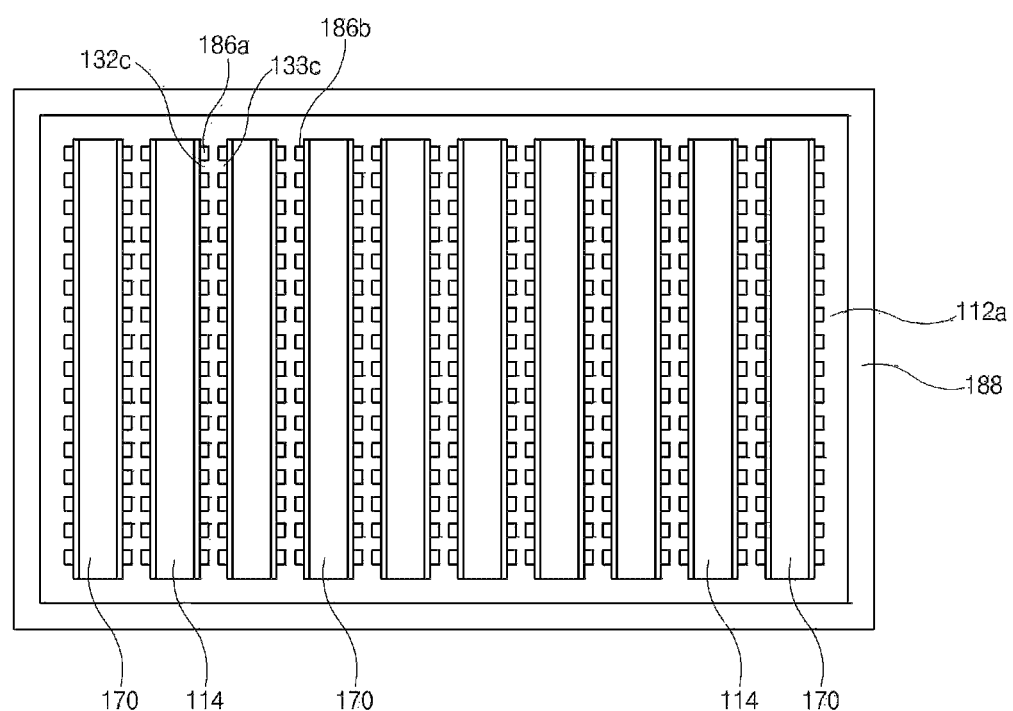
FIG. 8 is a plane view of a rear side of a chamber lead for a substrate treating apparatus according to an embodiment of the present invention.

FIG. 8 is a plane view of a rear side of a chamber lead for a substrate treating apparatus according to an embodiment of the present invention. Referring to FIG. 10, the plasma source electrodes 114 and the plasma ground electrodes 170 are disposed on a rear surface of the chamber lead 112a to face the susceptor 116 (of FIG. 2). The plasma source electrodes 114 and the plasma ground electrodes 170 are alternately arranged with each other.

Edges 188 of the chamber lead 112a are combined with the chamber body 112b (of FIG. 2). When the plasma source electrode 114 is disposed at an outermost side of the chamber lead 112a to face the chamber lead 112b, there is an undesired plasma discharging between the plasma source electrode 114 and the chamber body 112b. Accordingly, to prevent the undesired plasma discharging, the plasma ground electrode 170 is disposed at an outermost side of the chamber lead 112a. Namely, the plasma source electrodes 114 and the plasma ground electrodes 170 are alternately arranged, and two of the plasma ground electrodes 170 are disposed at outermost sides. The plasma ground electrodes 114 at the outermost sides include the second protrusions 186b and the second discharging portion 133c. Alternatively, there is no second protrusions 186b and second discharging portion 133c on the plasma ground electrodes 114 at the outermost sides.

Referring to FIG. 2, the gas injection hole 182 is disposed between the plasma source electrode 114 and the plasma ground electrode 170 to provide the first and second process gases onto the substrate 164 on the susceptor 116. Namely, the first and second process gases are activated or ionized in the first discharging portion 132c of the plasma source electrode 114 and the second discharging portion 133c of the plasma ground electrode 170 and provided onto the substrate 164 through the gas injection hole 182.

To uniformly provide the first and second process gases onto the substrate 164 or the susceptor 116, the number of the gas injection holes 182 is controlled. When the chamber lead 112a has a constant area, a width of each of the plasma source electrode 114 and the plasma ground electrode 170 is controlled to control the number of the gas injection holes 182. In other word, the number of the gas injection holes 182 is increased by decreasing the width of each of the plasma source electrode 114 and the plasma ground electrode 170. On the contrary, the number of the gas injection holes 182 is decreased by increasing the width of each of the plasma source electrode 114 and the plasma ground electrode 170.

In some embodiments of the present invention, the first through-hole and the second through-hole is respectively disposed at the crossing portion of the first horizontal portion and the first vertical portion of the first discharging portion and the crossing portion of the second horizontal portion and the second vertical portion of the second discharging portion, the first and second process gases are uniformly diffused along a vertical direction and a horizontal direction. Accordingly, the activated or ionized first and second process gases are uniformly provided onto the susceptor on the susceptor. As a result, properties of the thin film deposition process or the etching process are improved.

In addition, by controlling the number and the width of the plasma source electrode and plasma ground electrode, the plasma density and the number of gas injection holes are also controlled. As a result, properties of the thin film deposition process or the etching process are further improved.

It will be apparent to those skilled in the art that various modifications and variations can be made in the apparatus having an edge frame without departing from the spirit or scope of the invention. Thus, it is intended that the present invention covers the modifications and variations of this invention provided they come within the scope of the appended claims and their equivalents.

What is claimed is:

1. A gas distribution device for a substrate treating apparatus, the gas distribution device comprising:
    a plurality of plasma source electrodes having a first side surface;
    a plurality of plasma ground electrodes having a second side surface facing the first side surface, the plurality of plasma ground electrodes being alternately arranged with corresponding ones of the plurality of plasma source electrodes; and
    a first gas providing part disposed at each plasma source electrode and including a first space, a plurality of first through-holes in communication with the first space through the first side surface for providing a first process gas between one of the plurality of plasma source electrodes and a corresponding one of the plurality of plasma ground electrodes, and a first discharging portion located at the first side surface.

2. The gas distribution device according to claim 1, further comprising a second gas providing part disposed at each plasma ground electrode and including a second space, a plurality of second through-holes in communication with the second space through the second side surface for providing a second process gas between one of the plurality of plasma source electrodes and a-corresponding ones of the plurality of plasma ground electrodes, and a second discharging portion located at the second side surface.

3. The gas distribution device according to claim 2, wherein the second discharging portion includes a plurality of first horizontal portions and a plurality of first vertical portions crossing the plurality of first horizontal portions, and wherein the plurality of second through-holes are positioned at crossing portions of the plurality of first horizontal portions and the plurality of first vertical portions.

4. The gas distribution device according to claim 3, wherein the plasma ground electrode includes a plurality of first protrusions at the second side surface, and wherein the plurality of first protrusions are positioned between the plurality of first horizontal portions and the plurality of first vertical portions.

5. The gas distribution device according to claim 4, wherein each of the plurality of first protrusions has a height of about 3 to about 10 mm from the second side surface.

6. The gas distribution device according to 4, wherein the second discharging portion further includes a plurality of first sub-horizontal portions and a plurality of first sub-vertical portions crossing the plurality of first sub-horizontal portions, wherein the plurality of first sub-horizontal portions are positioned between the plurality of first horizontal portions, and wherein the plurality of first sub-vertical portions are positioned between the plurality of first vertical portions.

7. The gas distribution device according to claim 2, wherein the first discharging portion is substantially symmetrical to the second discharging portion with respect to a central plane between the plasma source electrode and the plasma ground electrode.

8. The gas distribution device according claim 4, wherein the plasma source electrode includes a plurality of second protrusions at the first side surface, and wherein the plurality of first protrusions are spaced apart from the plurality of second protrusions.

9. The gas distribution device according to claim 1, wherein the first discharging portion includes a plurality of second horizontal portions and a plurality of second vertical portions crossing the plurality of second horizontal portions, and wherein the plurality of first through-holes are positioned at crossing portions of the plurality of second horizontal portions and the plurality of second vertical portions.

10. The gas distribution device according to claim 9, wherein the plasma source electrode includes a plurality of second protrusions at the first side surface, and wherein the plurality of second protrusions are positioned between the plurality of second horizontal portions and the plurality of second vertical portions.

11. The gas distribution device according to claim 10, wherein each of the plurality of second protrusions has a height of about 3 to about 10 mm from the first side surface.

12. The gas distribution device according to 10, wherein the first discharging portion further includes a plurality of sub-horizontal portions and a plurality of sub-vertical portions crossing the plurality of sub-horizontal portions, wherein the plurality of sub-horizontal portions are positioned between the plurality of second horizontal portions, and wherein the plurality of sub-vertical portions are positioned between the plurality of second vertical portions.

13. A substrate treating apparatus, comprising:
    a process chamber including a chamber lead and a chamber body, the chamber lead and the chamber body combined to provide a reaction space;
    a susceptor in the reaction space, wherein a substrate is disposable on the susceptor; and
    a gas distribution device including:
        a plurality of plasma source electrodes having a first side surface and combined with the chamber lead;
        a plurality of plasma ground electrodes having a second side surface facing the first side surface, the plurality of plasma ground electrodes being alternately arranged with the plurality of plasma source electrodes and being combined with the chamber lead; and a first gas providing part disposed at each plasma source electrode and including a first space, a plurality of first through-holes in communication with the first space through the first side surface for providing a first process gas between one of the plurality of plasma source electrodes and a corresponding ones of the plurality of plasma ground electrodes, and a first discharging portion located at the first side surface.

14. The substrate treating apparatus according to claim 13, wherein the gas distribution device further includes a second gas providing part disposed at each plasma ground electrode and including a second space, a plurality of second through-holes in communication with the second space through the second side surface for providing a second process gas between one of the plurality of plasma source electrodes and a corresponding ones of the plurality of plasma ground electrodes, and a second discharging portion located at the second side surface.

15. The substrate treating apparatus according to claim 14, wherein the second discharging portion includes a plurality of first horizontal portions and a plurality of first vertical portions crossing the plurality of first horizontal portions, wherein the plurality of second through-holes are positioned at crossing portions of the plurality of first horizontal portions and the plurality of first vertical portions.

16. The substrate treating apparatus according to claim 15, wherein the plasma ground electrode includes a plurality of first protrusions at the second side surface, the plurality of first protrusions are positioned between the plurality of first horizontal portions and the plurality of first vertical portions.

17. The substrate treating apparatus according to claim 16, wherein each of the plurality of first protrusions has a height of about 3 to about 10 mm from the second side surface.

18. The substrate treating apparatus according to 16, wherein the second discharging portion further includes a plurality of first sub-horizontal portions and a plurality of first sub-vertical portions crossing the plurality of first sub-horizontal portions, wherein the plurality of first sub-horizontal portions are positioned between the plurality of first horizontal portions, and the plurality of first sub-vertical portions are positioned between the plurality of first vertical portions.

19. The substrate treating apparatus according to claim 14, wherein the first discharging portion is substantially symmetrical to the second discharging portion with respect to a central plane between the plasma source electrode and the plasma ground electrode.

20. The substrate treating apparatus according claim 14, wherein the plasma source electrode includes a plurality of second protrusions at the first side surface, and wherein the plurality of first protrusions are spaced apart from the plurality of second protrusions.

21. The substrate treating apparatus according to claim 13, wherein the first discharging portion includes a plurality of second horizontal portions and a plurality of second vertical portions crossing the plurality of second horizontal portions, wherein the plurality of first through-holes are positioned at crossing portions of the plurality of second horizontal portions and the plurality of second vertical portions.

22. The substrate treating apparatus according to claim 21, wherein the plasma source electrode includes a plurality of second protrusions at the first side surface, the plurality of second protrusions are positioned between the plurality of second horizontal portions and the plurality of second vertical portions.

23. The substrate treating apparatus according to claim 22, wherein each of the plurality of second protrusions has a height of about 3 to about 10 mm from the first side surface.

24. The substrate treating apparatus according to 22, wherein the first discharging portion further includes a plurality of second sub-horizontal portions and a plurality of second sub-vertical portions crossing the plurality of second sub-horizontal portions, wherein the plurality of second sub-horizontal portions are positioned between the plurality of second horizontal portions, and the plurality of second sub-vertical portions are positioned between the plurality of second vertical portions.

25. The substrate treating apparatus according to claim 13, wherein a first distance between each plasma source electrode and the susceptor is substantially equal to a second distance between each plasma ground electrode and the susceptor.

26. The substrate treating apparatus according to claim 13, wherein the gas distribution device further includes an insulator between the chamber lead and each plasma ground electrode.

27. The substrate treating apparatus according to claim 26, wherein a thickness of each plasma ground electrode is substantially equal to a summation of a thickness of each plasma ground electrode and a thickness of the insulator.

28. The substrate treating apparatus according to claim 13, wherein two of the plasma ground electrodes are positioned at outermost sides to be adjacent to the chamber body.

* * * * *